(12) United States Patent
Zhong et al.

(10) Patent No.: US 10,685,948 B1
(45) Date of Patent: Jun. 16, 2020

(54) DOUBLE SIDE MOUNTED LARGE MCM PACKAGE WITH MEMORY CHANNEL LENGTH REDUCTION

(71) Applicant: Apple Inc., Cupertino, CA (US)

(72) Inventors: Chonghua Zhong, Cupertio, CA (US); Jun Zhai, Cupertino, CA (US); Kunzhong Hu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/204,679

(22) Filed: Nov. 29, 2018

(51) Int. Cl.
*H01L 23/52* (2006.01)
*H01L 25/18* (2006.01)
*H01L 23/538* (2006.01)
*H01L 23/00* (2006.01)

(52) U.S. Cl.
CPC .......... *H01L 25/18* (2013.01); *H01L 23/5385* (2013.01); *H01L 24/16* (2013.01); *H01L 2224/16225* (2013.01)

(58) Field of Classification Search
CPC ................. H01L 25/18; H01L 23/5385; H01L 2224/16225; H01L 24/16
USPC ......................................................... 257/737
See application file for complete search history.

(56) References Cited

U.S. PATENT DOCUMENTS

| | | | |
|---|---|---|---|
| 9,153,550 B2 * | 10/2015 | Lin | H01L 24/14 |
| 9,818,680 B2 * | 11/2017 | Yazdani | H01L 21/486 |
| 9,997,231 B2 | 6/2018 | Hayashi et al. | |
| 2011/0140268 A1 | 6/2011 | Cheah et al. | |
| 2012/0250265 A1 | 10/2012 | Kawate | |
| 2016/0071818 A1 | 3/2016 | Wang et al. | |
| 2016/0329272 A1 | 11/2016 | Geissler et al. | |
| 2016/0372448 A1 * | 12/2016 | Yazdani | H01L 25/105 |
| 2017/0263518 A1 | 9/2017 | Yu et al. | |
| 2018/0182734 A1 | 6/2018 | Singh et al. | |

FOREIGN PATENT DOCUMENTS

WO 2017111975 6/2017

OTHER PUBLICATIONS

International Search Report and Written Opinion of International Application No. PCT/US2019/062701 dated Mar. 4, 2020, 14 pages.

* cited by examiner

*Primary Examiner* — Vu A Vu
(74) *Attorney, Agent, or Firm* — Jaffery Watson Mendonsa & Hamilton LLP

(57) ABSTRACT

Double side mounted package structures and memory modules incorporating such double side mounted package structures are described in which memory packages are mounted on both sides of a module substrate. A routing substrate is mounted to a bottom side of the module substrate to provide general purpose in/out routing and power routing, while signal routing from the logic die to double side mounted memory packages is provided in the module routing. In an embodiment, module substrate is a coreless module substrate and may be thinner than the routing substrate.

21 Claims, 4 Drawing Sheets

US 10,685,948 B1

DOUBLE SIDE MOUNTED LARGE MCM PACKAGE WITH MEMORY CHANNEL LENGTH REDUCTION

BACKGROUND

Field

Embodiments described herein relate to multi-chip module packaging, and more particularly to memory packaging.

Background Information

The current market demand for portable and mobile electronic devices such as mobile phones, personal digital assistants (PDAs), digital cameras, portable players, gaming, and other mobile devices requires the integration of more performance and features into increasingly smaller spaces. However, the amount of memory required to operate these devices has increased significantly.

Low power double data rate (LPDDR) standards have long been adopted across a variety of markets, including mobile electronics, to meet the performance and capacity requirements. LPDDR platforms and next generations (LPDDR-x) commonly include an arrangement of memory chips or packages around a logic die such as a system on chip (SOC) which may include a central processing unit (CPU) and/or graphics processing unit (GPU). In order to meet demands for increased bandwidth, various 3D solutions have been proposed that include stacked dynamic random-access memory (DRAM) dies, such as high bandwidth memory (HBM) and hybrid memory cube (HMC).

SUMMARY

Double side mounted package structures and memory modules incorporating such double side mounted package structures are described.

In an embodiment, a double side mounted package structure includes a module substrate, a first logic die mounted on a top side of the module substrate, a first plurality of memory packages mounted on the top side of the module substrate, a second plurality of memory packages mounted on a bottom side of the module substrate, and a routing substrate mounted to the bottom side of the module substrate and directly underneath the first logic die. A plurality of contacts are located on a bottom side of the routing substrate. General purpose in/out routing and power routing are provided through the routing substrate and the module substrate to connect the plurality of contacts on the bottom side of the routing substrate and the first logic die. Signal routing is provided within the module substrate to connect the first logic die with both the first plurality of memory packages and the second plurality of memory packages.

In an embodiment, a double side mounted package structure includes a coreless module substrate, a first logic die mounted on a top side of the coreless module substrate, a first plurality of memory packages mounted on the top side of the coreless module substrate, a second plurality of memory packages mounted on a bottom side of the coreless module substrate, and a laminate routing substrate mounted to the bottom side of the coreless module substrate and directly underneath the first logic die. A plurality of contacts are located on a bottom side of the laminate routing substrate. First routing is provided through the laminate routing substrate and the coreless module substrate to connect the plurality of contacts on the bottom side of the laminate routing substrate and the first logic die. Second routing is provided within the coreless module substrate to connect the first logic die with both the first plurality of memory packages and the second plurality of memory packages.

DETAILED DESCRIPTION

Figure 1:
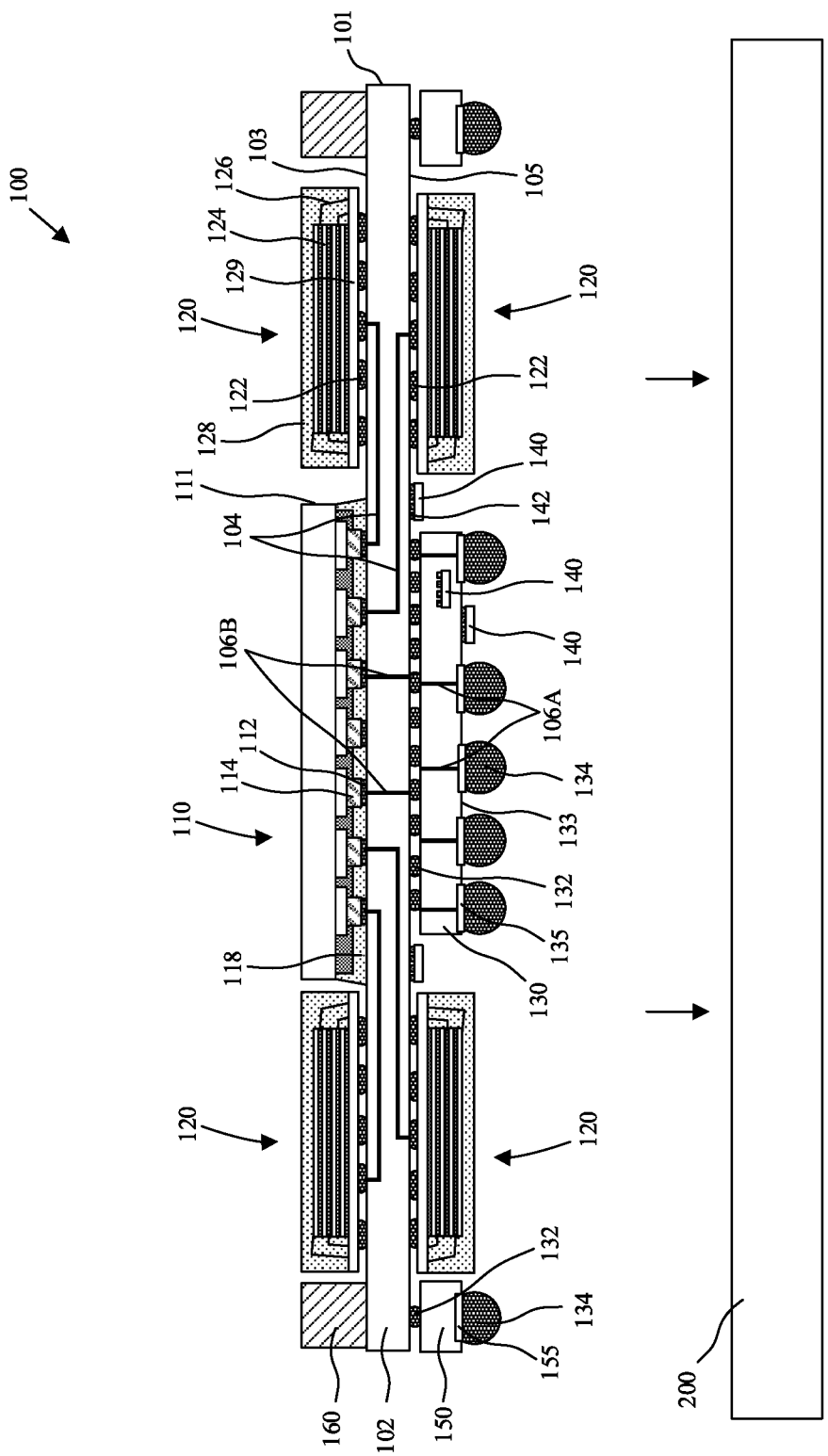
FIG. 1 is a cross-sectional side view illustration of a memory module including a double side mounted package structure taken along line A-A of FIG. 2 in accordance with an embodiment.

Embodiments describe double side mounted package structures and memory modules incorporating such double side mounted package structures in which memory packages are mounted on both sides of a module substrate to reduce overall package size and memory channel length.

In one aspect, it has been observed that as memory requirements increase, the memory packages have a dramatic effect on overall multi-chip module (MCM) package size. Larger MCM packages may cause memory channel length increase and performance degradation. Furthermore, substrate yield and cycle time can be a challenge in large MCM flip chip ball grid array (FCBGA) packages due to layer count and advanced design rules.

In accordance with embodiments, the module substrates are integrated vertically to reduce memory channel length, reduce overall MCM package size and reduce MCM package height. Furthermore, the stacked integration schemes may reduce module substrate design complexity, shorten substrate cycle time, and increase substrate yield. This may be accomplished by segregating high density, complex fine pitch signal routing within a module substrate, and less critical coarser pitch board routing within the stacked routing substrate. For example, the module substrate may be a coreless or thin core substrate compared to a more traditional MCM cored substrate that may have twenty-plus layers to accommodate all the required, general purpose in/out routing, power routing, and signal routing. The segregated substrate design in accordance with embodiments may additionally allow for reduced MCM package height.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "top", "bottom", "under", "to", "between", and "on" as used herein may refer to a relative position of one layer with respect to other layers. One layer on "top", "under", or "on" another layer or bonded "to" or in "contact" with another layer may be directly in contact with the other layer or may have one or more intervening layers. One layer "between" layers may be directly in contact with the layers or may have one or more intervening layers.

Figure 2:
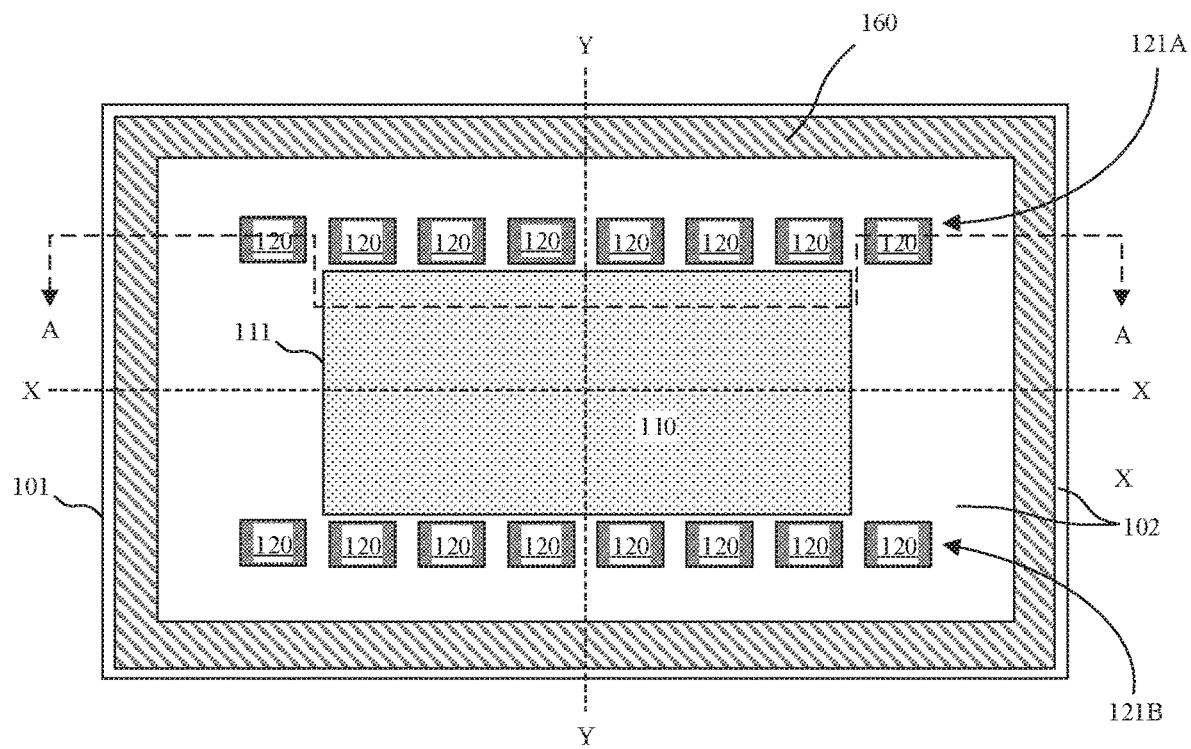
FIG. 2 is a schematic top view illustration of a double side mounted package structure in accordance with an embodiment.

Referring now to FIGS. 1-2, FIG. 1 a cross-sectional side view illustration is provided of a memory module including a double side mounted package structure 100 taken along line A-A of FIG. 2 in accordance with an embodiment. FIG. 2 is a schematic top view illustration of a double side mounted package structure 100 structure in accordance with an embodiment. As illustrated, a memory module may include a circuit board 200, and a double side mounted package structure 100 mounted on the circuit board 200. This may be accomplished using flip chip bonding and solder bumps 134.

The double side mounted package structure 100 in accordance with embodiments may include a module substrate 102, and a first logic die 110 mounted on a top side 103 of the module substrate 102. While a single logic die 110 is illustrated, there may be multiple logic dies 110. For example, multiple logic dies 110 may occupy the same perimeter illustrated by the first logic die 110 in FIG. 2. A first plurality of memory packages 120 are mounted on the top side 103 of the module substrate 102. As shown in FIG. 2, the first plurality of memory packages 120 may optionally include a first and second groups 121A, 121B mounted on opposite sides of the one or more logic dies 110. A second plurality of memory packages 120 are likewise mounted on a bottom side 105 of the module substrate 102. The second plurality of memory packages 120 may be mounted directly underneath the first plurality of memory packages 120, and likewise may be arranged in first and second groups.

The exemplary memory packages 120 illustrated include a plurality of memory dies 124 stacked on a substrate 129, connected with wire bonds 126, and encapsulated in a molding material 128. It is to be appreciated this is an exemplary implementation, and embodiments are not limited to this specific memory package configuration. In accordance with embodiments the memory packages 120 may be DRAM packages including one or more DRAM dies. Furthermore, the double side mounted package structures 100 may be implemented with a variety of memory technologies including LPDDR, LPDDR-x, HBM, HMC, etc.

Referring again to FIG. 1, a routing substrate 130 is mounted to the bottom side 105 of the module substrate 102 and directly underneath the first logic die 110 (or multiple logic dies 110). A plurality of contacts 135 exist on a bottom side 133 of the routing substrate 130. The solder bumps 134 may be placed on the contacts 135 for connection to the circuit board 200.

First routing is provided through the routing substrate and the coreless module substrate to connect the plurality of contacts on the bottom side of the routing substrate and the first logic die. In an embodiment, general purpose in/out routing and power routing 106A extends through the routing substrate. General purpose in/out routing and power routing 106B additionally extends through the module substrate 102. Together, the general purpose in/out routing and power routing 106A/B connect the plurality of contacts 135 on the bottom side 133 of the routing substrate 130 and the one or more logic die 110.

Second routing is provided within the module substrate to connect the first logic die with both the first plurality of memory packages and the second plurality of memory packages. In an embodiment signal routing 104 is located within the module substrate 102 to connect the logic die 110 with both the first plurality of memory packages 120 and the second plurality of memory packages 120 on opposite sides of the module substrate 102. Length of the signal routing 104 to each memory package 120 may, for example, correspond to the memory channel length. Thus, memory channel length can be reduced by mounting the memory packages 120 on opposite sides of the module substrate 102 as opposed to mounting the memory packages in multiple rows, or longer rows on a same side of a substrate. Furthermore, length of the signal routing 104 can be mitigated with a reduced thickness of the module substrate 102. In some embodiments, module substrate 102 is a coreless module substrate. This may avoid requirement for the formation of vias through a substrate core. Instead, fine line patterning techniques can be utilized for all routing lines within the module substrate 102.

The routing substrate 130 in accordance with embodiments may be thicker than the module substrate 102. In some embodiments, the routing substrate 130 can be a laminate routing substrate, and may be a cored laminate routing substrate. This may allow for cost reduction, utilizing less expensive processing for the routing substrate 130, which may additionally include coarser pitch, and wider line widths than the module substrate 102. This can be achieved since the signal routing 104 between the logic die(s) 110 and memory packages 120 is contained in the module substrate 102. Thus, the signal routing 104 within the module substrate 102 is characterized by a finer pitch and narrower line width than the general purpose in/out routing and the power routing 106A through the routing substrate 130. A thicker routing substrate 130 can additionally provide clearance for mounting on the circuit board 200, as well as for placement of discrete integrated passive devices (IPDs) 140, such as capacitor arrays, which can provide a variety of functions including voltage regulation of the general purpose in/out routing and the power routing to the logic dies 110. One or more discrete IPDs 140 can be mounted at a location such as a bottom side 133 of the routing substrate 130 laterally adjacent to the plurality of solder bumps 134 and a bottom side 105 of the module substrate 102. Discrete IPDs 140 can also be located within the routing substrate 130.

The double side mounted package structures 100 in accordance with embodiments may include various support structures for mechanical balancing due to the thin module substrate 102. For example, the module substrate 102 may lack some mechanical robustness that would otherwise be provided by a thick core. Mechanical balancing may be achieved using either, or a combination of, the routing substrate 130, stiffener ring 160, and optionally substrate bars 150. In the embodiments illustrated in FIGS. 1-2 a top side stiffener ring 160 is mounted to the top side 103 of the module substrate 102. The top side stiffener ring 160 may laterally surround the first plurality of memory packages 120 and the logic die(s) 110.

In the embodiment illustrated in FIG. 1, one or more substrate bars 150 are mounted to the bottom side 105 of the module substrate 102. The one or more substrate bars 150 may be laterally around the second plurality of memory packages 120 and the routing substrate 130. In an embodiment, the substrate bars 150 are formed of the same substrate material as the routing substrate 130, though this is not required. The substrate bars 150, may optionally be directly underneath the top side stiffener ring 160. In an embodiment, the substrate bars 150 may contain additional electrical routing. Thus, the substrate bars 150 may be mounted similarly as the routing substrate 130 using solder bumps 132, optionally on contacts 155 for electrical routing. Solder bumps 132 may be micro bumps smaller than solder bumps 134.

The double side mounted package structures in accordance with embodiments can include the one or more logic die(s) 110 mounted on the top side 103 of the module substrate 102 using solder bumps 112. As shown, solder bumps 112 may be applied to contacts 114. The mounted logic die(s) 110 can be secured with an underfill material 118. As shown, the logic die(s) 110 are in electrical connection with the general purpose in/out routing and power routing 106B and signal routing 104. The first and second pluralities of memory packages 120 may also be mounted on the top and bottom sides of the module substrate using solder bumps 122, and the routing substrate can be mounted to the bottom side 105 of the module substrate 102 with solder bumps 132. Similarly, substrate bars 150 may be mounted using solder bumps 132. Solder bumps 112, 122, 132 in accordance with embodiments may all be micro bumps and have smaller volume/area than solder bumps 134 for mounting to circuit board 200. Furthermore, the discrete IPDs 140 may also be mounted using solder bumps 142, which may be micro bumps of smaller volume/area than solder bumps 112, 122, 132.

In an embodiment such as that illustrated in FIG. 2 the one or more logic die(s) 110 is mounted in a center of the package 100, or module substrate 102. For example, the lateral edges 111 of the logic die 110 may be equidistant from a corresponding edge 101 of the package 100 (which may correspond to an edge of the module substrate 102) along one or more x-axis (illustrated by line X-X) or y-axis (illustrated by line Y-Y). The logic die 110 may additionally be symmetrical about the x-axis and/or y-axis. In another embodiment, the one or more logic die(s) 110 is not mounted in a center of the package 110, or module substrate 102.

Figure 3:
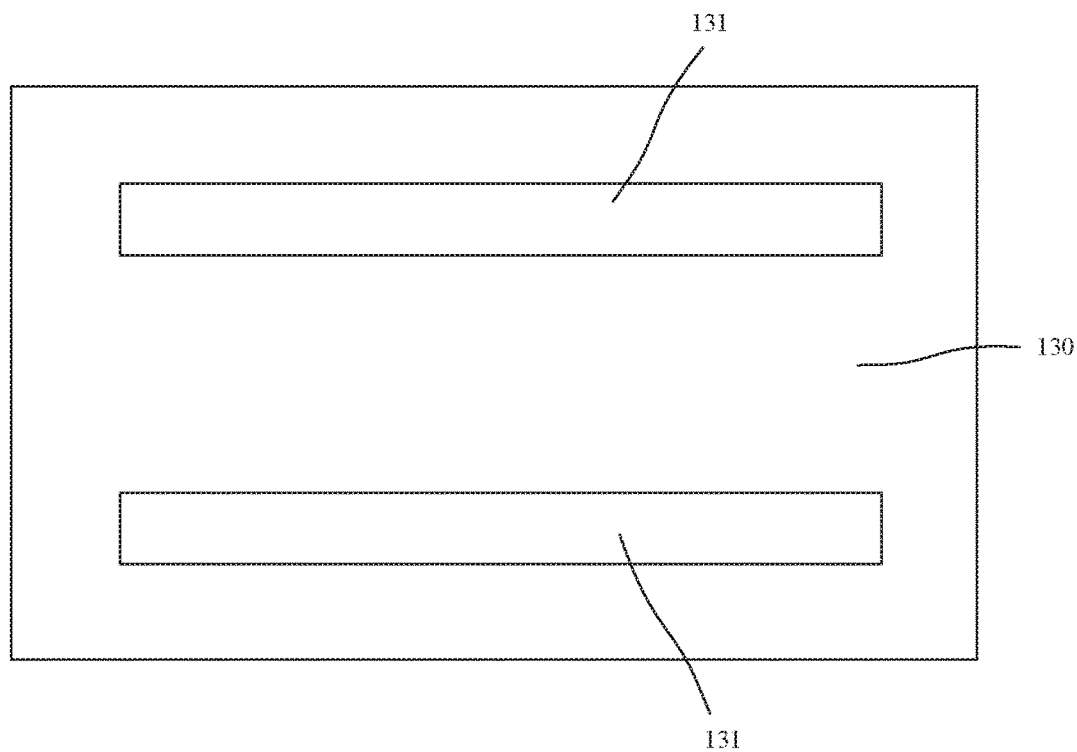
FIG. 3 is a schematic top view illustration of openings within a routing substrate in accordance with an embodiment.

Referring now to FIG. 3 a schematic top view illustration is provided of openings 131 within a routing substrate 130 in accordance with an embodiment. Openings 131 may extend completely through the routing substrate 130. In such a variation, the second plurality of memory packages 120 are mounted on the bottom side 105 of the module substrate 102 within the pair of openings 131 in the routing substrate 130, and laterally adjacent to the routing substrate 130. In this manner, the routing substrate 130 may provide additional mechanical balancing and support of the thin module substrate 102. Thus, the singular routing substrate 130 may negate inclusion of additional substrate bars 150.

Figure 4:
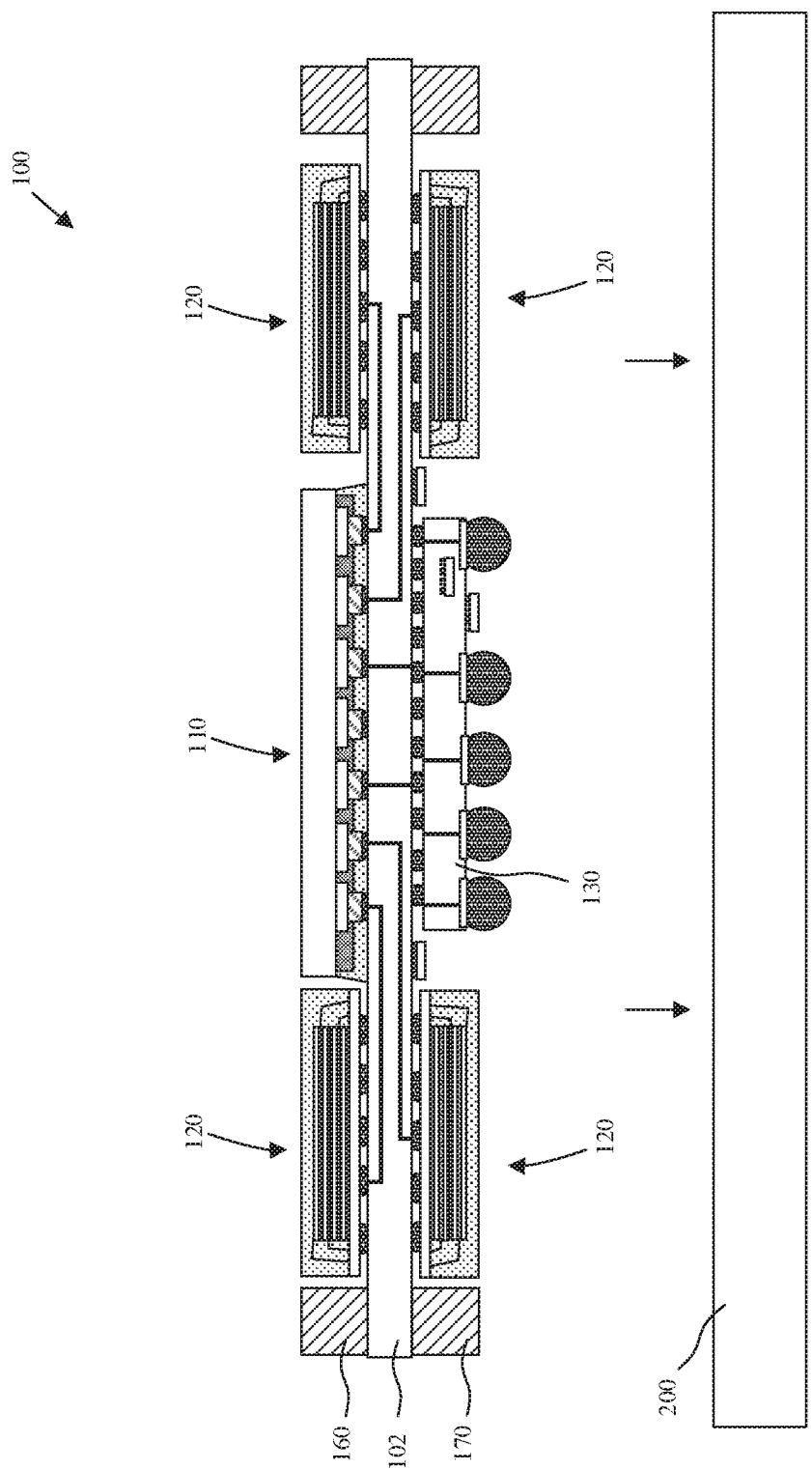
FIG. 4 is a cross-sectional side view illustration of a memory module including a double side mounted package structure taken along line A-A of FIG. 2 in accordance with an embodiment.

FIG. 4 is yet an additional variation. In the particular cross-sectional side view illustration provided a bottom side stiffener ring 170 is mounted to the bottom side 105 of the module substrate 102. The bottom side stiffener ring 170 laterally surrounds the second plurality of memory packages 120 and the routing substrate 130. The bottom side stiffener ring 170 may be identical to top side stiffener ring 160. The top and bottom side stiffener rings 160, 170 may be attached using suitable techniques including adhesive, solder, etc.

Figure 5:
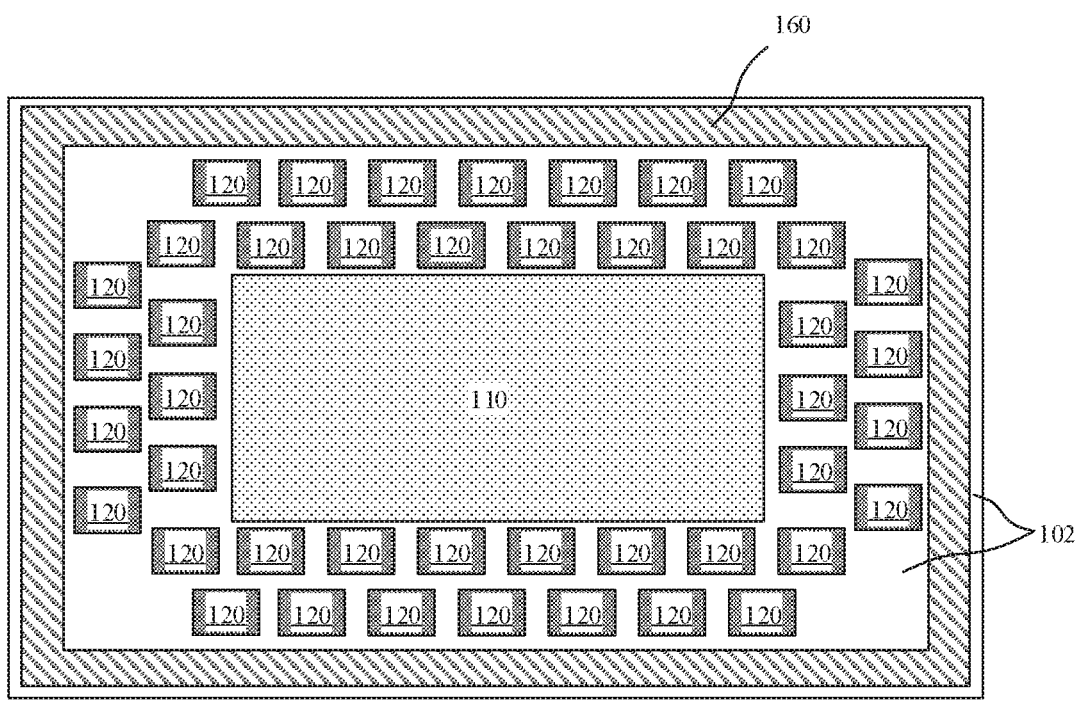
FIG. 5 is a schematic top view illustration of a double side mounted package structure in accordance with an embodiment including multiple rows of memory packages.

Up until this point various structural configurations have been described in which memory channel length can be reduced by mounting the memory packages 120 on opposite sides of the module substrate 102 as opposed to mounting the memory packages in multiple rows, or longer rows on a same side of a substrate. However, the double side mounted MCM package structures are additionally compatible with such configuration, particularly for larger memory scaling. FIG. 5 is a schematic top view illustration of a double side mounted package structure in accordance with an embodiment including multiple rows of memory packages. Embodiments are not limited to configurations including only first and second groups 121A, 121B of memory packages 120 mounted on opposite sides of the one or more logic dies 110. As shown, the memory packages 120 may be placed on more than two sides of a logic die 110, and may surround the one or more logic dies 110. Furthermore, multiple rows of memory packages 120 may be arranged around one or more sides of a logic die 110, and multiple rows of memory packages 120 may be arranged completely around a logic die 110. In the embodiment illustrated, the outside row, or group of memory packages 120 may be offset from the inner row, or group of memory packages 120 to allow for routing. Similar to the embodiments illustrated in FIGS. 1 and 3 the multiple rows of memory packages 120 may be mounted to both sides of the module substrate 102. Furthermore, the bottom side memory packages may be located directly underneath the top side of memory packages as previously described.

In utilizing the various aspects of the embodiments, it would become apparent to one skilled in the art that combinations or variations of the above embodiments are possible for forming an double side mounted MCM package. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A double side mounted package structure comprising:
a module substrate;
a first logic die mounted on a top side of the module substrate;
a first plurality of memory packages mounted on the top side of the module substrate;
a second plurality of memory packages mounted on a bottom side of the module substrate;
a routing substrate mounted to the bottom side of the module substrate and directly underneath the first logic die;
a plurality of contacts on a bottom side of the routing substrate;
general purpose in/out routing and power routing through the routing substrate and the module substrate to connect the plurality of contacts on the bottom side of the routing substrate and the first logic die; and
signal routing within the module substrate to connect the first logic die with both the first plurality of memory packages and the second plurality of memory packages;
wherein the signal routing within the module substrate is characterized by a finer pitch and narrower line width than the general purpose in/out routing and the power routing through the routing substrate.

2. The double side mounted package structure of claim 1, further comprising a top side stiffener ring mounted to the top side of the module substrate, wherein the top side stiffener ring laterally surrounds the first plurality of memory packages and the first logic die.

3. The double side mounted package structure of claim 2, further comprising a bottom side stiffener ring mounted to the bottom side of the module substrate, wherein the bottom side stiffener ring laterally surrounds the second plurality of memory packages and the routing substrate.

4. The double side mounted package structure of claim 2, further comprising one or more substrate bars mounted to the bottom side of the module substrate, wherein the one or more substrate bars are laterally around the second plurality of memory packages and the routing substrate.

5. The double side mounted package structure of claim 1, further comprising a pair of openings in the routing substrate, wherein the second plurality of memory packages are mounted on the bottom side of the module substrate within the pair of openings in the routing substrate.

6. The double side mounted package structure of claim 5, wherein the second plurality of memory packages are directly underneath the first plurality of memory packages.

7. The double side mounted package structure of claim 1, further comprising a plurality of solder bumps on a bottom side of the routing substrate.

8. The double side mounted package structure of claim 7, wherein:
the first logic die is mounted on the top side of the module substrate with solder bumps;
the first plurality of memory packages is mounted on the top side of the module substrate with solder bumps;
the second plurality of memory packages is mounted on the bottom side of the module substrate with solder bumps; and
the routing substrate is mounted to the bottom side of the module substrate with solder bumps.

9. The double side mounted package structure of claim 8, further comprising a discrete integrated passive device component mounted at a location selected from the group consisting of the bottom side of the routing substrate laterally adjacent to the plurality of solder bumps, a bottom side of the module substrate, and within the routing substrate.

10. A double side mounted package structure comprising:
a coreless module substrate;
a first logic die mounted on a top side of the coreless module substrate;
a first plurality of memory packages mounted on the top side of the coreless module substrate;
a second plurality of memory packages mounted on a bottom side of the coreless module substrate;
a laminate routing substrate mounted to the bottom side of the coreless module substrate and directly underneath the first logic die, wherein the laminate routing substrate is thicker than the coreless module substrate;
a plurality of contacts on a bottom side of the laminate routing substrate;
first routing through the laminate routing substrate and the coreless module substrate to connect the plurality of contacts on the bottom side of the laminate routing substrate and the first logic die; and
second routing within the coreless module substrate to connect the first logic die with both the first plurality of memory packages and the second plurality of memory packages.

11. The double side mounted package structure of claim 10, wherein the laminate routing substrate is a cored substrate.

12. The double side mounted package structure of claim 10, wherein the second routing within the coreless module substrate is characterized by a finer pitch and narrower line width than the first routing through the laminate routing substrate.

13. The double side mounted package structure of claim 10, further comprising a top side stiffener ring mounted to the top side of the coreless module substrate, wherein the top side stiffener ring laterally surrounds the first plurality of memory packages and the first logic die.

14. The double side mounted package structure of claim 13, further comprising a bottom side stiffener ring mounted to the bottom side of the coreless module substrate, wherein the bottom side stiffener ring laterally surrounds the second plurality of memory packages and the laminate routing substrate.

15. The double side mounted package structure of claim 10, further comprising a pair of openings in the laminate routing substrate, wherein the second plurality of memory packages are mounted on the bottom side of the coreless module substrate within the pair of openings in the laminate routing substrate.

16. The double side mounted package structure of claim 15, wherein the second plurality of memory packages are directly underneath the first plurality of memory packages.

17. The double side mounted package structure of claim 10, further comprising a plurality of solder bumps on a bottom side of the laminate routing substrate.

18. The double side mounted package structure of claim 17, further comprising a discrete integrated passive device component mounted at a location selected from the group consisting of the bottom side of the laminate routing substrate laterally adjacent to the plurality of solder bumps, a bottom side of the coreless module substrate, and within the laminate routing substrate.

19. A memory module comprising:
a circuit board;
a double side mounted package structure mounted on the circuit board, the double side mounted package structure comprising:
a module substrate;
a first logic die mounted on a top side of the module substrate;
a first plurality of memory packages mounted on the top side of the module substrate;
a second plurality of memory packages mounted on a bottom side of the module substrate; and
a routing substrate mounted to the bottom side of the module substrate and directly underneath the first logic die, wherein the routing substrate is thicker than the module substrate;
a plurality of contacts on a bottom side of the routing substrate;
general purpose in/out routing and power routing through the routing substrate and the module substrate to connect the plurality of contacts on the bottom side of the routing substrate and the first logic die; and
signal routing within the module substrate to connect the first logic die with both the first plurality of memory packages and the second plurality of memory packages.

20. The memory module of claim 19, wherein the module substrate is a coreless module substrate.

21. The memory module of claim 20, wherein the routing substrate is a cored laminate substrate.

\* \* \* \* \*

UNITED STATES PATENT AND TRADEMARK OFFICE
CERTIFICATE OF CORRECTION

PATENT NO. : 10,685,948 B1
APPLICATION NO. : 16/204679
DATED : June 16, 2020
INVENTOR(S) : Chonghua Zhong, Jun Zhai and Kunzhong Hu Page 1 of 1

It is certified that error appears in the above-identified patent and that said Letters Patent is hereby corrected as shown below:

In the Specification

Column 5, Line 48, delete "package 110" and insert in place there of --package 100--.

Signed and Sealed this
Twenty-seventh Day of October, 2020

Andrei Iancu
*Director of the United States Patent and Trademark Office*